United States Patent [19]
Sota

[11] Patent Number: 5,646,829
[45] Date of Patent: Jul. 8, 1997

[54] RESIN SEALING TYPE SEMICONDUCTOR DEVICE HAVING FIXED INNER LEADS

[75] Inventor: Yoshiki Sota, Tenri, Japan

[73] Assignee: Sharp Kabushiki Kaisha, Osaka, Japan

[21] Appl. No.: 455,626

[22] Filed: May 31, 1995

[30] Foreign Application Priority Data

Nov. 25, 1994 [JP] Japan .................................. 6-290259

[51] Int. Cl.⁶ .......................... H05K 5/02; H01L 23/495; H01L 23/498
[52] U.S. Cl. .......................... 361/813; 257/666; 257/668; 257/672; 257/676; 437/220
[58] Field of Search .................. 29/827; 174/52.1, 174/52.4; 257/666, 668, 670, 671, 672, 676, 692, 695; 361/813; 437/208, 209, 205, 220; 439/68, 330, 331

[56] References Cited

U.S. PATENT DOCUMENTS 4,908,933  3/1990  Sagisaka et al. ..................... 174/262

FOREIGN PATENT DOCUMENTS

| 62-147360 | 9/1987  | Japan . |
| 2-58356   | 2/1990  | Japan .................................... 437/209 |
| 2-105450  | 4/1990  | Japan . |
| 2-304961  | 12/1990 | Japan .................................... 257/787 |
| 2-302069  | 12/1990 | Japan .................................... 257/787 |
| 3-120851  | 5/1991  | Japan .................................... 257/787 |

*Primary Examiner*—Donald Sparks

[57] ABSTRACT

A resin sealing type semiconductor device is arranged such that respective surfaces of plural semiconductor chips, opposite to a circuit forming side, are fixed to both surfaces of a die pad having a smaller area than an area of one surface of each semiconductor chip and to both surfaces of leading end portions of inner leads using an insulating resin having a higher melting point than a heating temperature in a wire bonding process. According to the described arrangement, the deformation of the die pad and the inner lead by the molding process of the resin can be prevented, thereby reducing the production of inferior semiconductor devices in which metal wires or semiconductor chips protrude.

19 Claims, 5 Drawing Sheets

5,646,829

RESIN SEALING TYPE SEMICONDUCTOR DEVICE HAVING FIXED INNER LEADS

FIELD OF THE INVENTION

The present invention relates to a resin sealing type semiconductor device of a both-sided mounting type whereon semiconductor chips are mounted on both surfaces of a lead frame.

BACKGROUND OF THE INVENTION

A generally used resin sealing type semiconductor device includes a semiconductor chip 21, a die pad 22, an inner lead 23, a gold wire 25 and a sealing resin 27 as shown in FIG. 6. The semiconductor device is composed of a lead frame having a structure called "down set" in which the die pad 22 is formed in a lower level than the inner lead 23.

The assembly process of the resin sealing type semiconductor device will be explained below. First, a single semiconductor chip 21 is die-bonded to one surface of the die pad 22 of the lead frame. Then, in the die-bonded lead frame, the semiconductor chip 21 and the inner lead 23 are electrically connected through the gold wire 25 by the wire bonding technique. Further, the semiconductor chip 21, the die pad 22 and the inner lead 23, etc., are formed in a package using the sealing resin 27, thereby completing the assembly process of the resin sealing type semiconductor device.

The current market demands electric apparatuses with improved performances and functions, which are of compact size and light weight by mounting many components on a single substrate, or mounting at least the same number of components on a smaller substrate. To address this demand, it is required to improve the mounting density of the LSI efficiently, and the technique for sealing plural semiconductor chips in a single resin sealing device has been developed.

For example, as shown in FIG. 7, plural semiconductor chips 21 may be sealed in one package by mounting plural semiconductor chips 21 on one surface of the lead frame. This method employs the wire bonding technique, etc., when electrically connecting the semiconductor chip 21 and the inner lead 23, and connecting the semiconductor chip 21 and the semiconductor chip 21 both through the gold wire 25. In this conventional method, plural semiconductor chips 21 are mounted two-dimensionally, thereby presenting a problem in terms of mounting density such that the package itself becomes larger in size.

The technique of solving the above-mentioned problem is disclosed, for example, by Japanese Laid-Open Utility Model Application No. 147360/1987 (Jitsukaisho 62-147360). As shown in FIG. 8, to both surfaces of the die pad 22 which is not down set, two semiconductor chips 21 are respectively die-bonded as the back surfaces thereof are bonding faces. Further, the semiconductor chip 21 thus die-bonded and the inner lead 23 are connected using the wire bonding technique. Thereafter, the semiconductor chip 21 and the inner lead 23 are formed in a package using the sealing resin 27.

Another semiconductor device is disclosed by, for example, Japanese Laid-Open Patent Application No. 105450/1990 (Tokukaihei 2-105450) having a structure shown in FIG. 9. The semiconductor device is assembled in the following manner. First, the semiconductor chip 21 is die-bonded to the lead frame which is not down set, and process up to the wire bonding process is performed. Then, two lead frames thus processed are stacked in such a manner that the respective back surfaces thereof are in contact with one another so as to seal the resin.

In order to achieve a thinner semiconductor package for mounting thereon semiconductor chips on both surfaces of the lead frame, it is required to adopt an extremely thin resin on the bonding wire. For example, in the structure shown in FIG. 8, in the case where the semiconductor package with a thickness of 1 mm is adopted, and the respective thicknesses of the die pad 22 and the semiconductor chip 21 are set to 0.1 mm and 0.2 mm, and the height of the gold wire 25 is set to 0.15 mm, the resin on the gold wire 25 on one surface becomes extremely thin (thickness of 0.1 mm).

In the conventional semiconductor package, the portion of the die pad is supported only by a support bar. Therefore, due to the pressure of the resin applied to the semiconductor chips in the molding process using the resin, the support bar for supporting the die pad is easily deformed, and the die pad is formed in a slanted position. In this case, as the sealing resin is thin, the gold wire and the semiconductor chip protrude from the surface of the package, thereby presenting the problem that the semiconductor chips become unpresentable.

In the package structure where the semiconductor chips are mounted on both surfaces of the lead frame, since the die pad is not down set, the die pad is easily deformed when forming the mold.

On the other hand, since the leading end of the inner lead is separated lead by lead, when adopting the thin lead frame, the inner lead may be deformed by the pressure from the resin applied in the molding process, thereby presenting the problem that the gold wire may be pushed up and protrude from the surface of the package, or the gold wire may break or contact the adjoining inner leads.

Alternatively, when sealing semiconductor chips of a large size with the resin, in the conventional package, since the die pad portion and the leading end portion of the inner lead are separated, it is necessary to ensure at least a predetermined distance between the end of the semiconductor chip and the outer side of the resin portion of the package. Moreover, in general, since only the leading end portions of the inner leads are silver-plated for electrically connecting to the semiconductor chips, the semiconductor chips of the large size cannot be sealed in a package of the same size as the compact semiconductor chips. Namely, it is necessary to set the distance from the semiconductor chip to the bonding position of the inner leads not less than the distance between the die pad and the leading end portions of the inner leads. Therefore, in the case of sealing the semiconductor chips of the large size with the resin, a large size package is required.

In order to die-bond the semiconductor chips to both surfaces of the lead frame, it is necessary to displace the bonding positions of the inner lead side when the wire bonding process is applied. This has been the drawback of sealing the semiconductor chips of the large size.

As described, in order to contain two semiconductor chips in a single semiconductor package, it is necessary to prevent the die pad, to which the semiconductor chips are die-bonded, from being inclined by the pressure of the resin applied in the molding process as surely as possible. Further, when sealing the semiconductor chips of the large size, it is necessary to set the distance between the semiconductor chips and the wire bonding positions shorter in order to prevent an increase in size of the package.

SUMMARY OF THE INVENTION

An object of the present invention is to provide means for sealing resin, which prevents a die pad from deforming by the pressure of the resin applied in a molding process, and enables semiconductor chips of a large size to be formed in a compact package.

In order to achieve the above object, the resin sealing type semiconductor device in accordance with the present invention includes:

a die pad supported by a support bar;

a lead frame having inner leads; and an insulating fixing member for securing leading end portions on a die pad side of the inner leads to the die pad.

According to the described arrangement, since the die pad and the inner leads are bonded by the insulating fixing member, the die pad and the inner leads can be prevented from deforming in the molding process, etc. As a result, a gold wire and semiconductor chips can be prevented from protruding from the resin surface, thereby achieving an improved productivity by reducing the production of inferior products.

For the fixing member, it is preferable to use an insulating resin having a higher melting point than the heating temperature in the wire bonding process.

The resin sealing type semiconductor device having the described arrangement may further include:

semiconductor chips to be respectively bonded to both surfaces of the die pad; and a bonding wire for electrically connecting the semiconductor chip to the inner lead, wherein leading end portions of the inner leads reach button portions of the semiconductor chips.

According to the above-mentioned arrangement, the position of the inner lead where the bonding wire is bonded can be brought closer towards the semiconductor chip. As a result, the required size of the package molded with the resin can be reduced. Furthermore, by adopting the inner leads which are entirely silver plated, the bonding wires can be bonded at any position of the inner leads. Therefore, it is not required to alter the size of the lead frame according to the size of the chip, thereby reducing a manufacturing cost as a new lead frame is not required to adjust the difference in size of the semiconductor chips.

Another resin sealing type semiconductor device of the present invention is characterized by comprising:

a lead frame including inner leads;

semiconductor chips; and an insulating fixing member for fixing leading end portions of the inner leads by inserting the leading end portions between respective surfaces opposite to surfaces whereon circuits are formed of the semiconductor chips.

In the described arrangement, the die pad is not required, and the leading end portions of the inner leads are fixed by the fixing member. Therefore, the die pad and the inner leads can be prevented from deforming when molding, etc. As a result, the gold wire and the semiconductor chips can be prevented from protruding from the surface of the resin, thereby achieving an improved productivity by reducing the production of inferior products.

The fixing member is arranged so as to apply an adhesive agent made of an insulating resin to both surfaces of a tape substrate member made of an insulating resin. Alternatively, it may be arranged such that the adhesive agent made of an insulating resin is applied to one surface of the tape substrate member made of an insulating resin. Additionally, a tape-shaped adhesive agent made of an insulating resin may be used as the fixing member.

By inserting the fixing member in a space formed between the inner leads, the contact between the inner leads can be prevented when molding, etc.

For a fuller understanding of the nature and advantages of the invention, reference should be made to the ensuing detailed description taken in conjunction with the accompanying drawings.

DESCRIPTION OF THE EMBODIMENTS

The following descriptions will discuss one embodiment of the present invention in reference to FIG. 1(a)–FIG. 2(b), FIG. 3(a)–FIG. 3(e), FIG. 4 and FIG. 5.

First, the manufacturing process of the resin sealing type semiconductor device in accordance with one embodiment of the present invention will be explained in reference to FIG. 3(a)–FIG. 3(e).

The resin sealing type semiconductor device of the present embodiment adopts a flat lead frame which is not down set. First, an insulating resin 6 is applied to the surface of a die pad 2, and to the leading end portions in a vicinity of the die pad 2 of support bars 4 and inner leads 3. The insulating resin 6 may be polyimide, etc., having a higher melting point than a heating temperature at which wire bonding is applied. The following explanations will be given through the case of adopting the insulating resin 6 as the polyimide resin. The polyimide resin includes two types: thermal hardening resin and thermal plasticizing resin. When adopting the thermal hardening polyimide resin, the resin is melted to a solvent with a certain viscosity. On both surfaces of the die pad 2, and of the leading end portions in a vicinity of the die pad 2 of the support bars 4 and the inner leads 3, the resin dissolved in the solvent is dropped and applied by potting. Then, a primary drying process is applied, for example, for one hour at low temperature of around 100° C. Thereafter, both surfaces of the lead frame are pressed by a mold coated with polytetrafluoroethylene so as to have a uniform thickness of the resin on the inner leads 3. Furthermore, the secondary drying process is applied, for example, for one hour at high temperature of around 260° C. so as to remove the solvent and harden the insulating resin 6 (FIG. 3(a)).

Figure 3A:
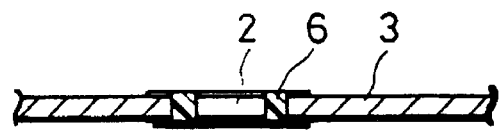
FIG. 3(a) through FIG. 3(e) are sectional views showing the structures of the resin sealing type semiconductor device of the first embodiment at respective stages in the manufacturing process.
Figure 3B:
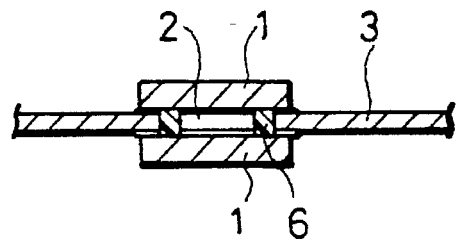

Thereafter, two semiconductor chips 1 are respectively die-bonded to both surfaces of the die pad 2 using a die-bonding agent (see FIG. 3(b)).

On the other hand, the case of adopting the thermal plasticizing polyimide resin will be explained below. First, the polyimide resin is solved to be applied to the both surfaces of the die pad 2 and the leading end portions in a vicinity of the die pad 2 of the support bars 4 and the inner leads 3 as in the case of the thermal hardening resin. Thereafter, while applying heat, the primary drying processing is performed, and the lead frame is pressed by the mold at high temperature, thereby removing the solvent so as to obtain a uniform thickness of the resin on the surfaces of the inner leads 3 by the mold. The viscosity of the thermal plasticizing polyimide resin is lowered with an application of heat. Because of this characteristic, by heating the polyimide resin, when die-bonding, the thermal plasticizing polyimide resin can be used as the die bonding agent. Here, the thickness of the resin between the inner lead 3 and the semiconductor chip 1 is set to 20–30 μm in order to ensure the electrically insulating property.

Figure 3C:
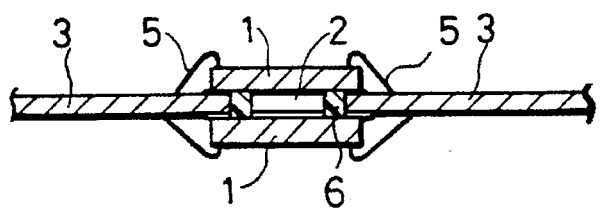

Using the insulating resin 6, the die pad 2 and the leading end portions of the support bars 4 in a vicinity of the die pad 2 and the inner leads 3 are fixed, and after applying the die-bonding of the semiconductor chips 1 and the die pad 2, the semiconductor chips 1 and the inner leads 3 are bonded using gold wires 5 (see FIG. 3(c)) by the wire bonding technique. Here, first, the wire bonding process is applied to one surface of the semiconductor chip 1 in an ordinary process. Thereafter, the surface whereon the semiconductor chip 1 is mounted is set to the lower side, and the wire bonding process is applied with respect to the semiconductor chip 1 on the other surface while supporting the surfaces of the semiconductor chips 1 or the inner leads 3.

Here, the inner lead 3 to be wire-bonded is supported by the outer side than the position at which the back surface is wire-bonded. The positions on the inner leads 3 where the bonding wires are to be wire bonded differ between the upper and the lower surfaces. However, since the leading end portions of the inner leads 3 are inserted between the semiconductor chips 1, the positions on the inner leads 3 where the gold wires 5 are wire-bonded are closer to the semiconductor chips 1 compared with the conventional arrangement. As a result, the size of a package can be reduced compared with the conventional arrangement.

By adopting the inner leads 3 which are entirely silver-plated for electrically connecting with the semiconductor chips 1, it is not necessary to alter the shape of the lead frame according to the chip size, and the same lead frame can be applied to the different chip size. Here, for the insulating resin 6, it is desirable to select such a resin having a higher melting point than the heating temperature (around 250° C.) in the wire bonding process.

Instead of potting the above-mentioned polyimide resin, a tape whereon a polyimide resin adhesive agent is applied to one surface or both surfaces of a tape substrate composed of polyimide resin, or a tape composed of only the polyimide resin adhesive agent without including the tape substrate, may be used. In the case of adopting a thermal hardening adhesive agent, the adhesive agent is applied to one surface of a tape, and the surface having applied thereto the adhesive agent is applied onto the lead frame. The tape is bonded to both surfaces of the lead frame, and the semiconductor chip 1 is die-bonded using a paste.

On the other hand, in the case of adopting a thermal plasticizing adhesive agent, after applying the adhesive agent to both surfaces of a tape, the tape is bonded to both surfaces of the lead frame. Thereafter, the semiconductor chip 1 is die-bonded using the thermal plasticizing adhesive agent. Here, since the thermal plasticizing polyimide resin also serves as a die-bonding agent, the paste is not required. However, the adhesive agent may be applied only to one surface of the tape substrate so as to die-bond using the paste. Moreover, even in the case of adopting the tape without including the substrate, the thermal hardening resin and the thermal plasticizing resin may be used as in the case of adopting the tape including the substrate. These tapes are pasted by means of a tool at 250° C.–300° C. When adopting the tape, when pasting the tape, the both surfaces of the lead frame are pressed by the polytetrafluoroethylene coated mold, thereby filling the space between the inner leads 3 with the insulating resin 6.

Figure 3D:
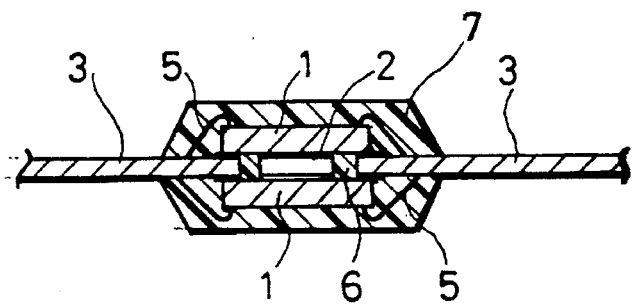
Figure 3E:
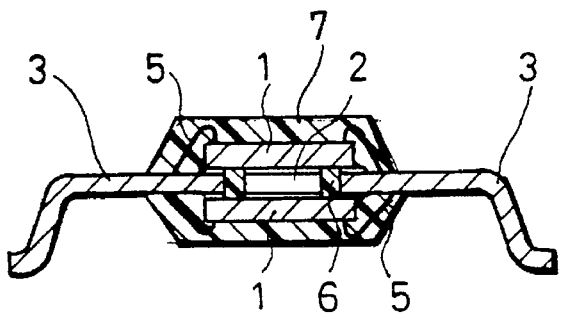

Thereafter, the sealing resin 7 is molded (see FIG. 3(d)), and the formation of the outer leads is performed, thereby manufacturing the resin sealing type semiconductor device (FIG. 3(e)).

Figure 1:
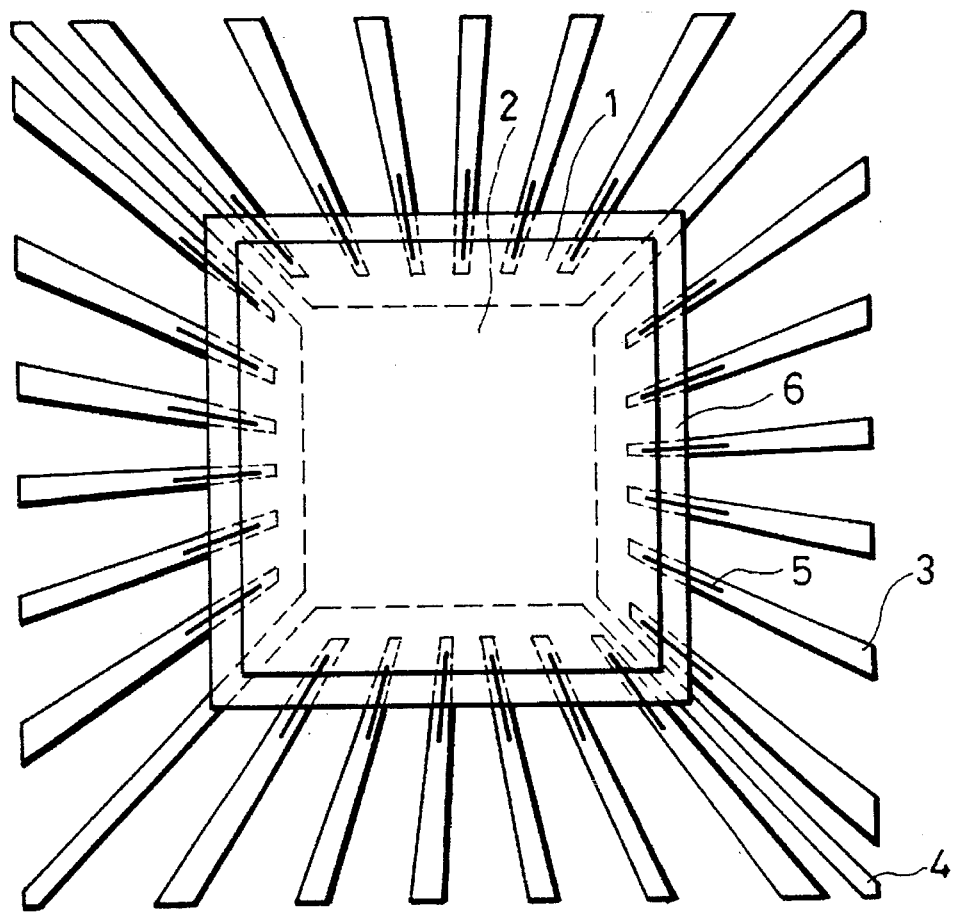
FIG. 1(a) is a plan view showing a structure of a resin sealing type semiconductor device in accordance with the first embodiment of the present invention.
FIG. 1(b) is a sectional view of the resin sealing type semiconductor device of FIG. 1(a).
Figure 1:
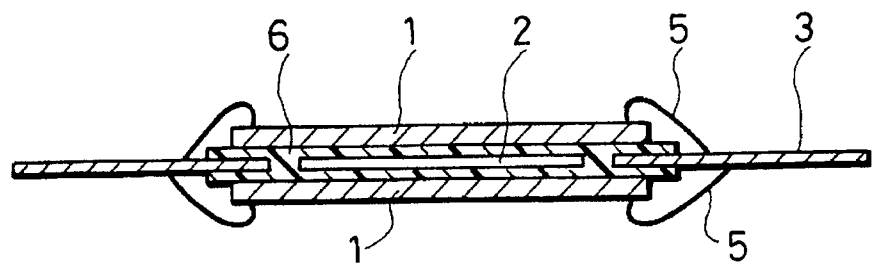
Figure 2:
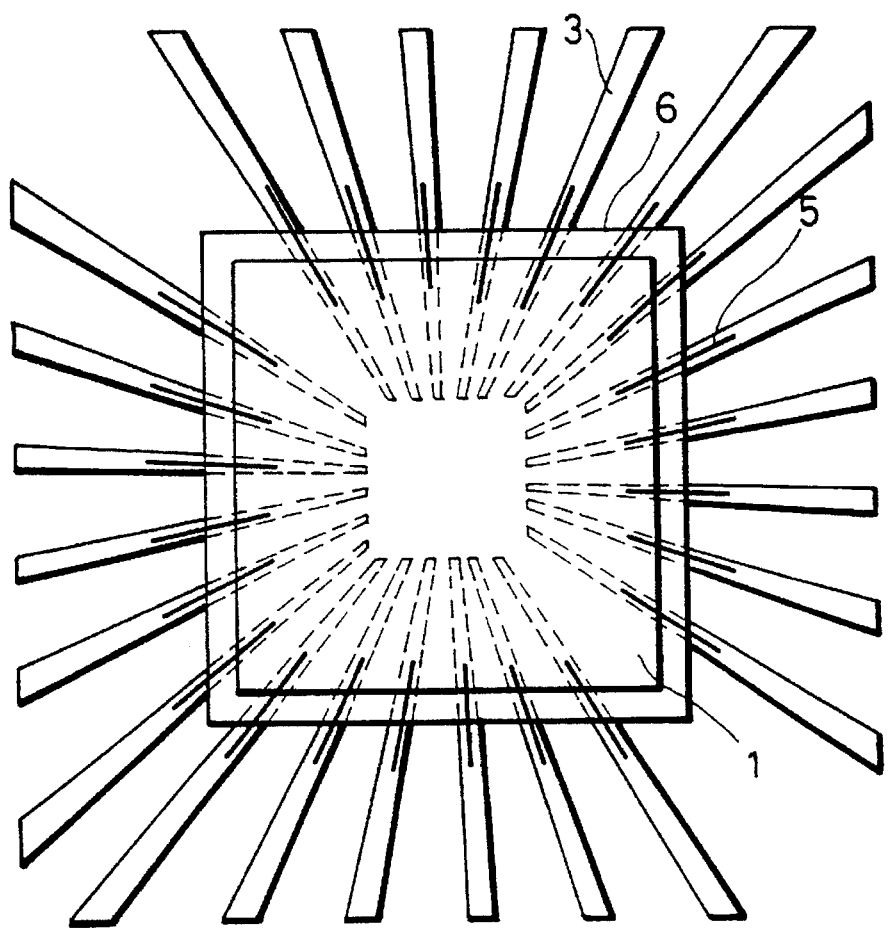
FIG. 2(a) is a plan view showing the structure of the resin sealing type semiconductor device in accordance with the second embodiment of the present invention.
FIG. 2(b) is a sectional view of the resin sealing type semiconductor device of FIG. 2(a).
Figure 2:
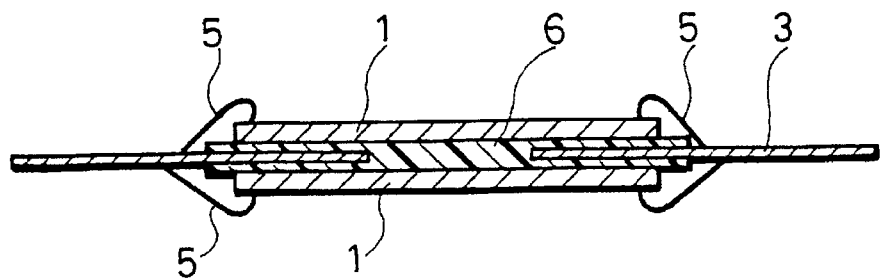

In the second embodiment of the present invention shown in FIG. 2, the flat lead frame composed of only the inner leads 3 without including the die pad 2 is adopted. In this arrangement, the above-mentioned insulating resin 6 is either applied or pasted in a form of a tape to the central portion of the package so as to fix the leading end portions of the inner leads 3. Then, the semiconductor chips 1 are formed on both surfaces of the lead frame through the insulating resin 6. The described arrangement offers the same effect as the arrangement of the first embodiment.

Figure 4:
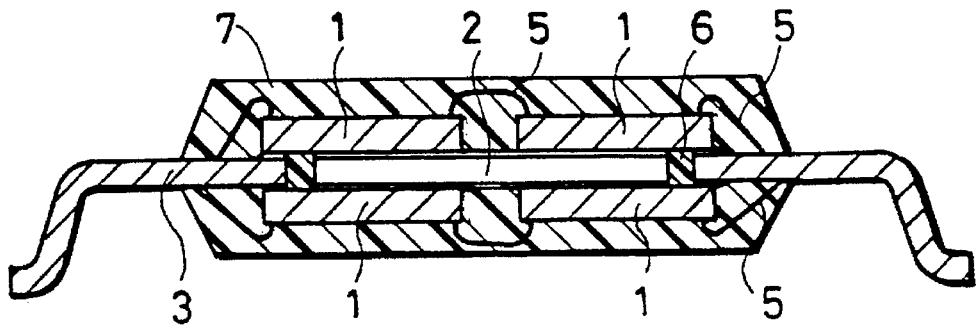
FIG. 4 is a sectional view showing the structure of the resin sealing type semiconductor device in accordance with the third embodiment of the present invention.
Figure 5:
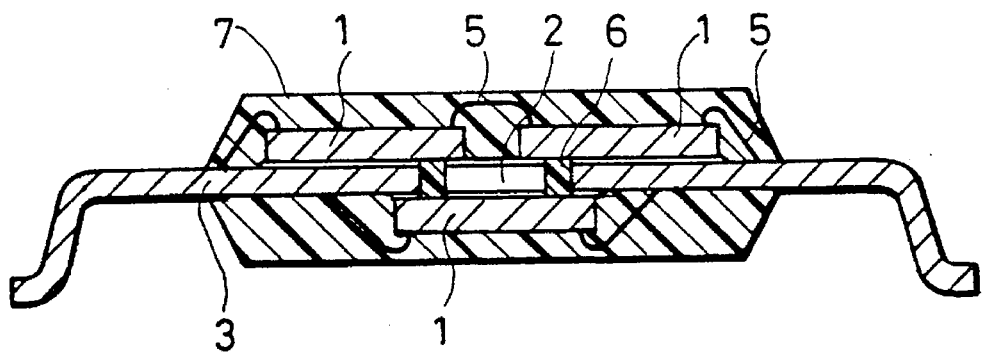
FIG. 5 is a sectional view showing the structure of the resin sealing type semiconductor device in accordance with the fourth embodiment of the present invention.
Figure 6:
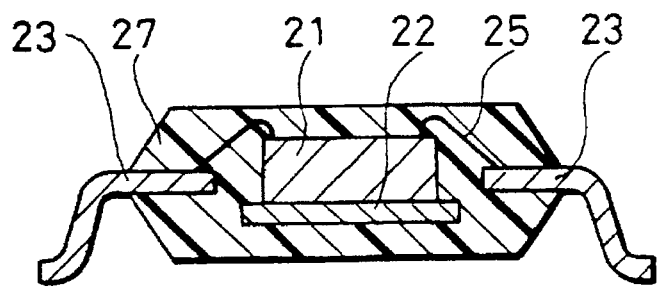
FIG. 6 is a sectional view showing one example of the structure of a conventional resin sealing type semiconductor device.
Figure 7:
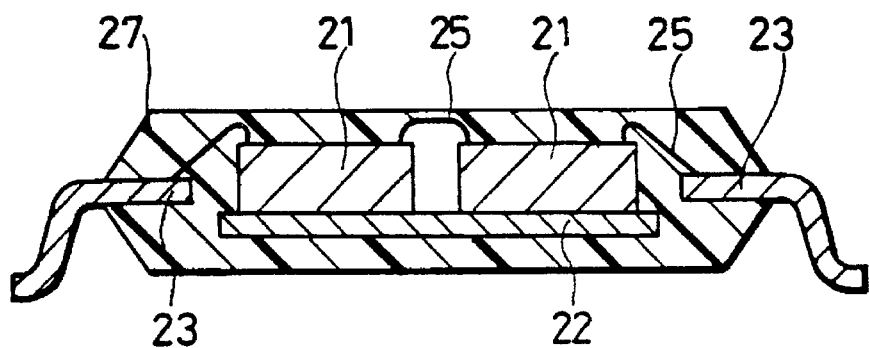
FIG. 7 is a sectional view showing another example of the structure of the conventional resin sealing type semiconductor device.
Figure 8:
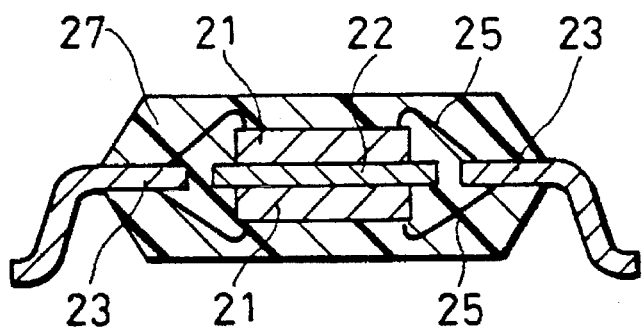
FIG. 8 is a sectional view showing a still another example of the structure of the conventional resin sealing type semiconductor device.
Figure 9:
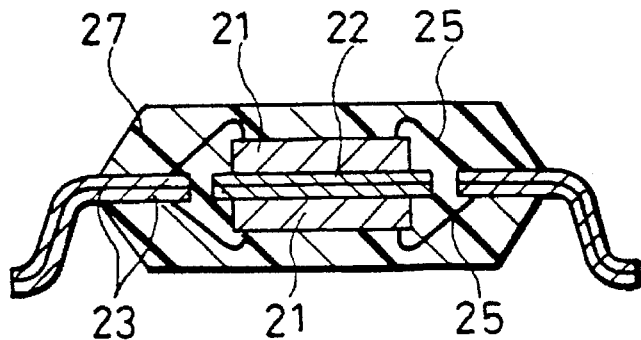
FIG. 9 is a sectional view showing a still another example of the structure of the conventional resin sealing type semiconductor device.

As shown in FIG. 4, plural semiconductor chips 1 may be formed on both surfaces of the lead frame. Moreover, as shown in FIG. 5, if both surfaces of the lead frame are not symmetrical in the state where the semiconductor chip 1 is mounted, the application area of the insulating resin 6 may be altered on each surface of the lead frame.

The arrangement of the described preferred embodiment is characterized in that the leading end portions of the inner leads 3, the die pad 2 and the support bars 4 are fixed using the insulating resin 6, and the die pad 2 is supported by the inner leads 3 and the support bars 4, while in the conventional arrangement, the die pad 2 is supported only by the support bars 4. The described arrangement offers the following effects: The die pad and the inner leads can be prevented from deforming when sealing with the resin, and an improved productivity can be achieved by reducing the production of inferior products in which the gold wires or the semiconductor chips protrude.

By adopting the inner leads 3 which are entirely silver-plated, an additional effect can be achieved. Namely, the semiconductor chip of a larger chip size can be mounted in the package of the same size, thereby permitting a larger capacity and lower cost compared with the conventional arrangement. Furthermore, since it is not necessary to alter the lead frame according to the size of the chip, the lead frame can be applied to chips of various sizes, thereby achieving a reduction in cost for preparing a new lead frame due to the difference in the size of the chip.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A resin sealing type semiconductor device, comprising:

a die pad;

inner leads;

an insulating fixing member for securing leading end portions on a die pad side of the inner leads to said die pad in a flat state and coating both surfaces of said die pad;

semiconductor chips directly die-bonded to said fixing member; and bonding wires for electrically connecting said semiconductor chips to said inner leads, wherein the leading end portions of said inner leads are extended so as to be inserted between a bottom surface of said semiconductor chip mounted on one surface of said die pad and a bottom surface of the semiconductor chip mounted on the other surface of said die pad.

2. The resin sealing type semiconductor device as set forth in claim 1, wherein:

said insulating fixing member is made of insulating resin having a higher melting point than a heating temperature in a wire bonding process.

3. The resin sealing type semiconductor device as set forth in claim 2, wherein:

said melting point is above 250° C.

4. The resin sealing type semiconductor device as set forth in claim 1, wherein:

said inner leads are entirely silver plated.

5. The resin sealing type semiconductor device as set forth in claim 1, wherein:

said insulating fixing member is composed of a tape substrate member made of insulating resin, an adhesive agent made of insulating resin being applied to both surfaces.

6. The resin sealing type semiconductor device as set forth in claim 1, wherein:

said insulating fixing member is composed of a tape substrate member made of insulating resin, having an adhesive agent made of insulating resin on one surface.

7. The resin sealing type semiconductor device as set forth in claim 1, wherein:

said insulating fixing member is composed of a tape adhesive agent made of insulating resin.

8. The resin sealing type semiconductor device as set forth in claim 1, wherein:

said insulating fixing member is inserted in a space formed between said inner leads.

9. A resin sealing type semiconductor device, comprising:

inner leads;

semiconductor chips;

an insulating fixing member for securing leading end portions of said inner leads in a flat state and for forming mounting surfaces for said semiconductor chips; and bonding wires for electrically connecting said semiconductor chips to said inner leads, wherein said semiconductor chips are directly die-bonded to both of the mounting surfaces, and the leading end portions of said inner leads are extended so as to be inserted between a bottom surface of said semiconductor chip mounted on one mounting surface of said fixing member and a bottom surface of the semiconductor chip mounted on the other mounting surface of said fixing member.

10. The resin sealing type semiconductor device as set forth in claim 9, wherein:

said insulating fixing member is made of insulating resin having a higher melting point than a heating temperature in a wire bonding process.

11. The resin sealing type semiconductor device as set forth in claim 9 wherein said inner leads are entirely silver plated.

12. The resin sealing type semiconductor device as set forth in claim 9, wherein:

said insulating fixing member includes a thermal hardening resin.

13. The resin sealing type semiconductor device as set forth in claim 9, wherein:

said insulating fixing member is made of a thermal plasticizing resin, and the resin placed between said inner leads and the semiconductor chips has a thickness in a range of 20–30 μm.

14. The resin sealing type semiconductor device as set forth in claim 9, wherein:

said insulating fixing member is composed of a tape substrate member made of insulating resin, an adhesive agent made of insulating resin being applied to both surfaces.

15. The resin sealing type semiconductor device as set forth in claim 9, wherein:

said insulating fixing member is composed of a tape substrate member made of insulating resin having an adhesive agent made of insulating resin formed on one surface of said tape substrate member.

16. The resin sealing type semiconductor device as set forth in claim 15, wherein:

said adhesive agent includes a thermal hardening resin.

17. The resin sealing type semiconductor device as set forth in claim 9, wherein:

said insulating fixing member is composed of a tape adhesive agent made of insulating resin.

18. The resin sealing type semiconductor device as set forth in claim 9, wherein:

said insulating fixing member is inserted into a space between said inner leads.

19. The resin sealing type semiconductor device as set forth in claim 9, having no die pad such that said semiconductor chips are supported by only said inner leads and said fixing member.

* * * * *